United States Patent [19]

Akahori et al.

[11] Patent Number: 5,296,404
[45] Date of Patent: Mar. 22, 1994

[54] METHOD FOR FORMING A THIN FILM FOR A SEMICONDUCTOR DEVICE

[75] Inventors: Takashi Akahori, Hyogo; Akira Tanihara, Kyoto, both of Japan

[73] Assignee: Sumitomo Metal Industries, Ltd., Osaka, Japan

[21] Appl. No.: 779,497

[22] Filed: Oct. 24, 1991

[30] Foreign Application Priority Data

Oct. 24, 1990 [JP] Japan .................. 2-287765
Jun. 7, 1991 [JP] Japan .................. 3-162365

[51] Int. Cl.$^5$ .................................. H01L 21/441
[52] U.S. Cl. .................................. 437/173; 437/190; 437/192; 437/195; 427/126.1
[58] Field of Search .................. 427/126.1; 437/192, 437/190, 173, 195

[56] References Cited

U.S. PATENT DOCUMENTS

| | | | |
|---|---|---|---|
| 4,401,054 | 8/1983 | Matsuo et al. | |
| 4,570,328 | 2/1986 | Price et al. | 437/192 |
| 4,800,176 | 1/1989 | Kakumu et al. | |
| 4,878,994 | 11/1989 | Jucha et al. | 427/38 X |
| 4,973,883 | 11/1990 | Hirose et al. | 315/111.41 |
| 5,080,927 | 1/1992 | Ikeda et al. | 427/126.1 X |

OTHER PUBLICATIONS

Journal of Vacuum Science and Technology: Part A; vol. 7, No. 1, Jan. 1989, New York US pp. 31 ∝ 35.
Journal of Vacuum Science and Technology: Part A; vol. 4, No. 6, Nov. 1986 New York US pp. 2726–2730.

*Primary Examiner*—John S. Maples
*Attorney, Agent, or Firm*—Armstrong, Westerman, Hattori, McLeland & Naughton

[57] ABSTRACT

A method for forming a thin film, comprising the steps of:
generating a plasma in a plasma generation chamber by action of an electric field generated by a microwave and a magnetic field generated by an exciting coil arranged around; and
introducing the generated plasma into a reaction chamber, resulting in forming a thin film on a sample placed on a sample stage, wherein it is a chracteristic to form a metal nitride film on said sample, by introducing Ar, H$_2$, and N$_2$ gas into said plasma generation chamber, while introducing a metallic gas into said reaction chamber.

By the method according to the present invention, it is possible to form a thin film having good Step Coverage on the contact hole, in addition, on the side wall of the contact hole a thinner film can be formed than that on the bottom. As a result, in the next step, filling in with interconnection materials can be surely performed, resulting in improving reliability of LSI devices.

8 Claims, 17 Drawing Sheets

THICK ON THE BOTTOM

THICK ON THE BOTTOM

X-ray(CoKα) diffraction pattern

THIN ON THE BOTTOM

OCCURENCE OF VOID

METHOD FOR FORMING A THIN FILM FOR A SEMICONDUCTOR DEVICE

BACKGROUND OF THE INVENTION

1. Field of the Invention

The present invention relates to a method for forming a thin film and to a semiconductor device and more particularly, to a method for forming a thin film such as TiN film which is formed as a barrier layer on the inside surface of a contact hole in a semiconductor device and to the semiconductor device in which the thin film was formed.

2. Description of the Relevant Art

A contact section in a semiconductor device such as a LSI device has a diffusion layer on the surface of a substrate as serving a base which is connected with an interconnection such as Al through a contact hole.

However, as LSI devices get further refined and more highly integrated, the diffusion layer formed on the surface of the substrate becomes shallower. Problems arise in the shallow diffusion layer such as an Al spike occurs and destroys a connection or Si deposits on the bottom of the contact hole, which results in increasing contact resistance.

In order to solve these problems, Al alloys (e.g. Al-1% Si) previously contaminated with about 0.5-2% of Si are used as the electrode connection material, but even these Al alloys recently are insufficient to prevent deposition of Si since the diameter of the contact hole is smaller than before.

Accordingly, forming a thin film called a barrier metal between the Al alloy and a Si substrate for prevention of diffusion has been considered. A TiN film is known as a barrier metal on account of its small electrical resistance and chemical stability (Yamanishi, Yoshihara, Kitahara, and Hosokawa; "Vacuum", Vol. 30 No. 5 P347, 1987).

A TiN film has so far been formed by the "Reactive Sputtering" method. The Reactive Sputtering method forms a TiN film on a substrate 31 by using Ti as a target 30 and providing Ar and $N_2$ as a sputtering gas in such an device as shown in FIG. 21 (Kanamori; "Vacuum", Vol. 29 No. 9 P418, 1986). Reference numeral 32 designates a coil.

However, by this method, wherein step coverage is poor, a TiN film is formed in the contact section as shown in FIG. 22(a). As a semiconductor device gets more highly integrated to 64MDRAM, and next to 256MDRAM, the aspect ratio (hole depth/hole diameter) of contact hole 3 becomes gradually higher. As a result, by this method almost no TiN film is formed on the bottom of a contact hole 35, so that it becomes impossible to use this method. In other words, even if in a state shown in FIG. 22(a) where electrode material such as W(tungsten) or Al is filled in, a void 36 occurs inside the contact hole 35. As a result, the interconnection broken thereby resulting in losing its function as a barrier metal, so that it is impossible to maintain the reliability of the LSI devices produced.

Accordingly, the LPCVD method (Low Pressure Chemical Vapor Deposition method), one of the thermal CVD methods, began to be as a method for forming a thin film having good step coverage. This method forms a TiN film on a substrate by thermal reaction with using $TiCl_4$, and $NH_3$ or $N_2$ gas as materials in such an device as shown in FIG. 23 (N. Yokoyama et al., Vol. 136 No. 3, J. Electrochem. Soc., P882)(N. Yokoyama et al., Vol. 138 No. 1, J. Electrochem. Soc., P190).

However, since the formation of a TiN film by reaction of $TiCl_4 + N_2 + H_2$ requires a high temperature of about 900~1000° C. which has an adverse influence on device characteristics, the method had a problem that it cannot be applied to production of a LSI device (Arthur Sherman, Extended Abstract of the 1991 International Conference on Solid State Devices and Materials, 1991 P177~179).

On the other hand, since the reaction of $TiCl_4 + NH_3$ takes place at a low temperature, a method wherein $NH_3$ gas is used was promising for forming a barrier metal for a LSI device. However, there was a problem that $TiCl_4$ and $NH_3$ form a complex ($TiCl_4 \cdot nNH_3$) in the vapor-phase, which yield a yellow powder resulting in the generation of particles (M. J. Buiting, et al., J. Electrochem. Soc., Vol. 138, No. 2, February 1991 P500). Besides, by the LPCVD method, a TiN film is comformally formed in a contact section as shown in FIG. 24(a). In the case of the formation of the barrier metal by the LPCVD method, a TiN film 33 is sufficiently formed on the bottom of a contact hole 35, which is preferable as a barrier metal. However a TiN film of the same thickness as that on the bottom of the contact hole 35 is simultaneously formed on the side wall of the contact hole. The formation of a thick film of TiN on the side wall in this fashion results in a small diameter of the hole remaining in the contact hole 35. It therefore is substantially the same situation in which a contact hole of a large aspect ratio is formed. Consequently, in the next step, when W(tungsten) or Al and the like are filled in, a void 36 occurs in the contact hole 35 as shown in FIG. 24(b). This another problem so as to maintain reliability of a LSI device is created.

In the LPCVD method, such a device as shown in FIG. 23 is used as mentioned above. Reference numeral 40 designates a chamber wherein a gas nozzle 41 and a sample stage 42 are arranged, and on the sample stage 42, a substrate 43 is placed. The bottom of the chamber 40 is connected with a booster pump 44 and a rotary pump 45, and the gas nozzle 41 is connected with a pipe 47 for $NH_3$ gas supply.

SUMMARY OF THE INVENTION

In consideration of the above-mentioned problems, the present inventors studied to accomplish the following invention.

That is, the present invention chiefly consists of using Ar, $H_2$, $N_2$ gas and a metallic compound gas, generating a plasma in a plasma generation chamber by action of electric field generated by a microwave and a magnetic field generated by an exciting coil arranged around, and introducing the generated plasma into a reaction chamber, thereby resulting in the formation of a thin film of metal nitride on a sample placed on a sample stage.

By this method, formation of a thin film having good step coverage in a contact hole, and, in addition having a thickness on the side wall of a contact hole which is thinner than that on the bottom of the contact hole is an object of the present invention.

Moreover, it is another object of the present invention to provide a method for forming a thin film at a low temperature which has no adverse influence on a LSI device, and in addition, which produces no particles such as yellow powder.

BRIEF DESCRIPTION OF THE DRAWINGS

FIG. 9 (b) is a sectional view showing the contact hole with W(tungsten) filled in after FIG. 9 (a);

FIG. 22 (b) is a sectional view showing W(tungsten) filled in after FIG. 22(a);

FIG. 24 (b) is a sectional view showing W(tungsten) filled in after FIG. 24 (a).

DETAILED DESCRIPTION OF THE INVENTION

Figure 1:
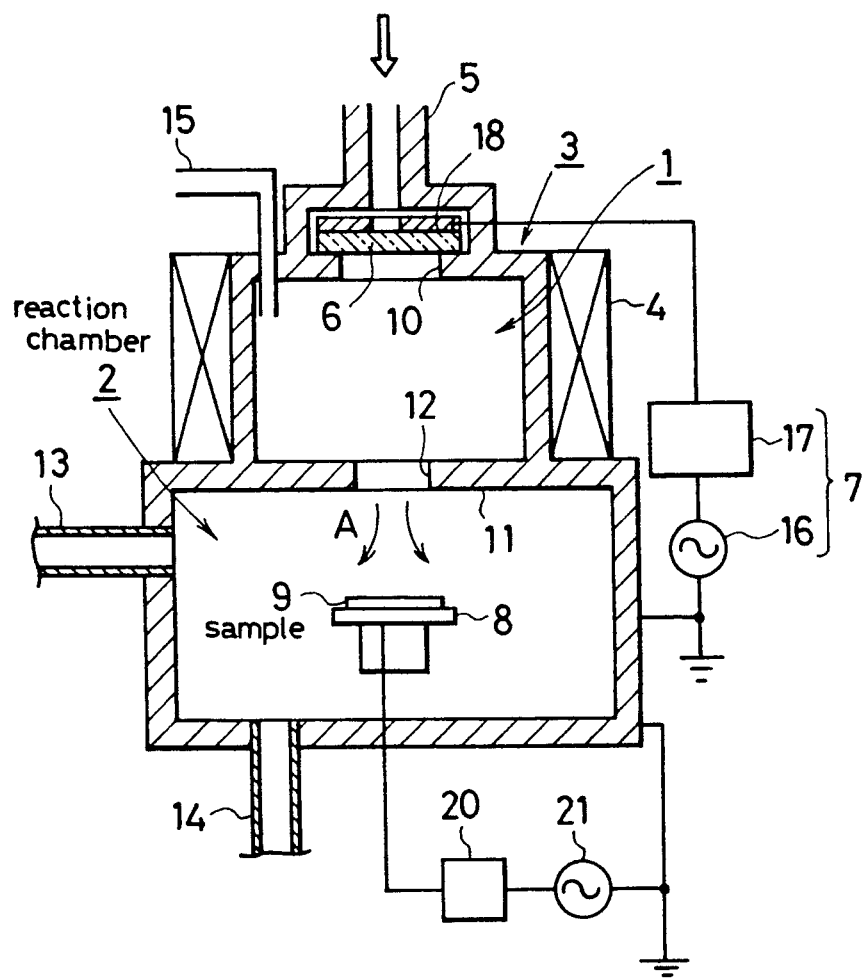
FIG. 1 is diagrammatic sectional view showing an example of a thin film formation device according to the present invention.

In more detail, methods for forming a thin film according to the present invention have the characteristics as follows;

(1) in a method of generating a plasma in a plasma generation chamber by action of an electric field generated by a microwave and a magnetic field generated by an exciting coil arranged around, introducing said plasma into a reaction chamber, and forming a thin film on a sample placed on a reation chamber, by means of introducing Ar, H$_2$, and N$_2$ gas into the plasma generation chamber, while introducing a metallic compound gas into the reaction chamber forming a metal nitride film on said sample;

(2) in a method of generating a plasma in a plasma generation chamber by action of an electric field generated by a microwave and a magnetic field generated by an exciting coil arranged around, introducing said plasma into a reaction chamber, and forming a thin film on a sample placed on a reation chamber, by means of introducing Ar, H$_2$, N$_2$ gas and said metallic compound gas into the plasma generation chamber, forming a metal nitride film on said sample;

(3) in a method for forming a thin film, introducing Ar, H$_2$ and N$_2$ gas into a plasma generation chamber, and introducing TiCl$_4$ gas into a plasma generation chamber or a reaction chamber; and generating a plasma in a plasma generation chamber by action of an electric field generated by a microwave and a magnetic field generated by an exciting coil arranged around the plasma generation chamber; and introducing the generated plasma into a reaction chamber by the magnetic field so as to form a thin Ti nitride film on a sample placed on a sample stage in the reaction chamber, which is a substrate for producing a semiconductor device having aninsulating film and having a contact hole thereon, pressure in the reaction chamber is less than 2.0 mTorr, temperature of said substrate forming the sample is more than 450° C.;

(4) in a method for forming a thin film, introducing Ar, H$_2$ and N$_2$ gas into a plasma generation chamber, and introducing TiCl$_4$ gas into a plasma generation chamber or a reaction chamber; and generating a plasma in a plasma generation chamber by action of an electric field generated by a microwave and a magnetic field generated by an exciting coil arranged around the plasma generation chamber; and introducing the generated plasma into a reaction chamber by the magnetic field so as to form a thin Ti nitride film on a sample placed on a sample stage in the reaction chamber, which is a substrate for producing a semiconductor device having aninsulating film and having a contact hole thereon, pressure in the reaction chamber is less than 1.3 mTorr, temperature of said substrate forming the sample is more than 450° C.;

(5) the thickness of its Ti nitride film on the bottom of the contact hole is thicker than that on the side wall of the contact hole; and (6) thickness of its Ti nitride film is 20~60% of that on the bottom of the contact hole;

Moreover, as a for method of forming a thin film, comprehended are;

(7) in the method according to (1) or (2), forming a film by applying RF(radio freguency) to a microwave inlet window; and (8) in the method according to (3), forming a film with applying RF to a microwave inlet window.

Besides, as for a semiconductor device according to the present invention, encompassed are those produced;

(9) by means of introducing Ar, H$_2$, and N$_2$ gas into a plasma generation chamber, while introducing titanium tetrachloride gas into a reaction chamber, generating a plasma in the plasma generation chamber by action of an electric field generated by a microwave and a magnetic field generated by an exciting coil arranged around, and introducing the generated plasma into the reaction chamber, thickness of a Ti nitride film formed on the bottom of the contact hole became thicker than that on the side wall of the contact hole;

(10) by means of introducing Ar, H$_2$, N$_2$ gas and titanium tetrachloride gas into a plasma generation chamber, generating a plasma in the plasma generation chamber by action of an electric field generated by a microwave and a magnetic field generated by an exciting coil arranged around, and introducing the generated plasma into the reaction chamber, thickness of a Ti nitride film formed on the bottom of the contact hole became thicker than that on the side wall of the contact hole;

(11) by means of a method according to (3), thickness of a Ti nitride film formed on the bottom of the contact hole became thicker than that on the side wall of the contact hole;

(12) by means of a method according to (4), wherein the thickness of the Ti nitride film formed on the bottom of a contact hole is thicker than the Ti nitride film on a side wall of the contact hole;

(13) by means of introducing Ar, H$_2$ and N$_2$ gas into a plazma formation chamber, while introducing titanium tetrachloride gas into a reaction chamber, generating a plasma in the plasma generation chamber by action of an electric field generated by a microwave and a magnetic field generated by an exciting coil arranged around, and introducing the generated plasma into the reaction chamber, thickness of a Ti nitride film formed on the side wall of the contact hole became 20~60% of that on the bottom of the contact hole;

(14) by means of introducing Ar, H$_2$, N$_2$ gas and titanium tetrachloride gas into a plasma generating chamber, generating a plasma in the plasma generation chamber by action of an electric field generated by a microwave and a magnetic field generated by an exciting coil arranged around, and introducing the generated plasma into the reaction chamber, thickness of a Ti nitride film formed on the side wall of the contact hole became 20~60% of that on the bottom of the contact hole;

(15) by means of a method according to (3), the thickness of a Ti nitride film formed on the side wall of the contact hole became 20~60% of that on the bottom of the contact hole;

(16) by means of a method according to (4), the thickness of a Ti nitride film formed on the side wall of the contact hole became 20~60% of that on the bottom of the contact hole; and

(17) in a method according to (3) or (4) wherein H$_2$ plasma treatment is carried out after forming the Ti nitride film.

In other words, according to the method described in (1), Ar and H$_2$ gas are supplied in a plasma generation chamber so as to accelerate the film formation, while a metallic compound gas such as TiCl$_4$ is introduced into a reaction chamber, and by passing through an exciting coil supplied direct current, a microwave is introduced in the plasma generation chamber through a wave guide and a microwave inlet window.

The microwave introduced in the plasma generation chamber activates Ar, H$_2$ and N$_2$ gas supplied in the plasma generation chamber, resulting in the generation of a plasma. When the generated plasma is introduced into the reaction chamber by the divergent magnetic field formed by the exciting coil, said metallic compound gas reacts on said plasma, resulting in the formation of metal nitride on the surface of a sample placed in the reaction chamber and forming a metal nitride film thereon.

According to the method described in (2), when Ar, H$_2$, N$_2$ gas and a metallic compound gas such as TiCl$_4$ are supplied in a plasma generation chamber, and with passing through an exciting coil supplied direct current, a microwave is introduced in the plasma generation chamber through a wave guide and a microwave inlet window, the microwave introduced in the plasma generation chamber activates Ar, H$_2$ and N$_2$ gas supplied in the plasma generation chamber, resulting in the generation of a plasma. When the generated plasma is introduced into the reaction chamber by the divergent magnetic field formed by the exciting coil said metallic compound gas reacts on N$_2$ and the like, a metal nitride is provided on the surface of a sample placed in the reaction chamber and a metal nitride film is formed thereon.

As the reaction mechanism of the metal nitride film formation, the following reaction equation is considered.

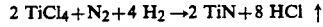

$$2\ TiCl_4 + N_2 + 4\ H_2 \rightarrow 2\ TiN + 8\ HCl \uparrow$$

In order to completely decompose TiCl$_4$ to Ti+Cl, very high energy of more than 400 Kcal mol$^{-1}$ is required.

In the method according to the present invention, by making resonance such as plasma CVD, especially electron cyclotron resonance excitation (ECR) plasma CVD, occur, high energy electrons are produced, and by collision of these electrons, reactions of decomposition and reduction are enhanced.

Accordingly, without a high sample temperature such as 900~1000° C., a metal nitrite film is formed on the surface of the sample.

Ar is introduced in order to stabilize the plasma discharge, and when RF is applied to the microwave inlet window in order to prevent a conductivity film from depositing on said window, Ar also acts as a sputtering gas of the conductivity film.

Figure 9A:
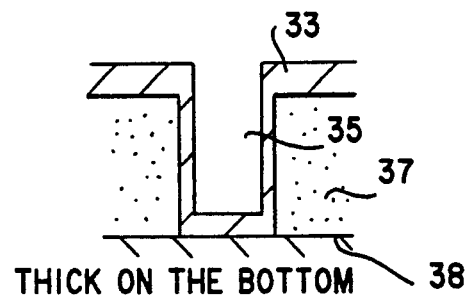
FIG. 9 (a) is a sectional view showing a TiN film formed on the contact hole by the method according to the examples.
Figure 9B:
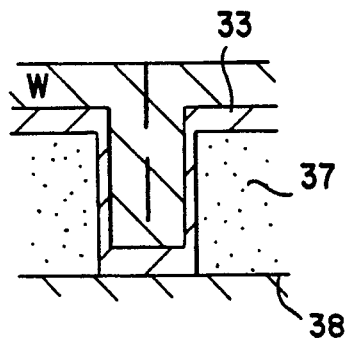
Figure 24A:
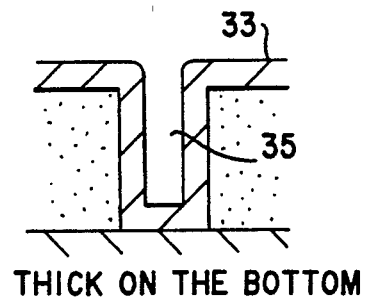
FIG. 24 (a) is a sectional view showing a TiN film formed on the contact hole by the LPCVD method.
Figure 24B:
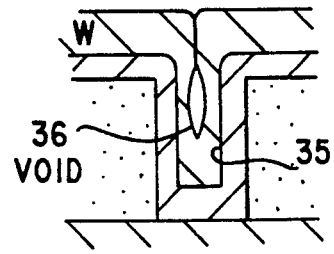

In the method according to the present invention, the generated plasma is supplied to the sample with good directivity, so that a metal nitride film is formed in the contact hole 35 as shown in FIG. 9(a). Consequently, in the next step, when are interconnction material such as W or Al is plugged up in the contact hole 35, no voids occur and plugging up is carried out as shown in FIG. 9(b), resulting in achievement of flattening interconnction.

DESCRIPTION OF PREFERRED EMBODIMENTS

Example 1

In this example, by the plasma CVD method, formation of a thin film of TiN on samples having holes of different aspect ratio on the surface is described as well as a plasma CVD apparatus used for forming a thin film according to this example.

The plasma CVD apparatus comprises a main body 3 comprising a plasma generation chamber 1 and a reaction chamber 2, an exciting coil 4 arranged around the plasma generation chamber 1 and connected with a direct current power source (not shown), a wave guide 5 for introducing a microwave generated from a microwave generator (not shown) into the plasma generation chamber 1, and so on. Reference numeral 6 designates a microwave inlet window comprising a quartz glass etc., reference numeral 7 designates a radio frequency generator 16 for applying to a radio frequency (RF) power supply on the microwave inlet window, and reference numeral 8 designates a sample stage on which a sample 9 is placed.

The plasma generation chamber 1, formed primarily in a cylindrical shape with first opening 10 for introducing a microwave formed almost at the center of the upper wall thereof, and, below the plasma generation chamber 1, a reaction chamber 2 having larger diameterthan the plasma generation chamber 1, are formed in one body. The reaction chamber 2 and the plasma generation chamber 2 are devided by a diaphragm 11 with second opening (for plasma extraction) 12 formed almost at a center thereof.

In addition, at the side wall of the reaction chamber 2, first guide pipe 13 is connected, and at the bottom of the reaction chamber 2, an exhaust pipe 14 is connected with exhaust system (not shown). At the upper wall of the plasma generationchamber 1, the second guide pipe 15 is connected.

High frequency generation source 7 comprises a high frequency oscillator 16 and a matching box 17, a flat electrode 18 inserted between the microwave inlet window 6 and the wave guide 5 such that RF is applied to the microwave inlet window 6. The sample stage 8 is connected with a RF radio frequency oscillator 21 for applying RF radio frequency to the sample 9 through a matching box 20. Applying the prescribed radio frequency to the sample 9 by the radio frequency oscillator 21, and operating the above-mentioned method for forming a thin film, makes it possible to form a thin film having good step coverage even in case of high aspect ratio.

Heating the sample 9 by a fixed heater and the like and maintaining the temperature of the sample 9 at the prescribed degree, such as 200~600° C., results in accelerating crystallization of a formed thin film and low film resistivity of the thin film.

When the exciting coil 4 is supplied with direct current, a definite magnetic field is produced in the plasma generation chamber 1. As a result, it is possible to form such a magnetic field with the angle frequency $\omega$ of the microwave introduced from the microwave oscillator into the plasma generation chamber 1 and angle frequency $\omega_c$ of the electron cyclotron being equal in the plasma formation chamber 1 such that the electrons have resonance movement. The condition under which said resonance is, produced, that is ECR condition, is easily determined by solving the following classical dynamic formula.

$$\omega = \omega_c = eB/m \qquad (1)$$

Here, e represents the charge of electron ($=1.6\times10^{-19}$ C), B represents the magnetic flux density (T), and m represents the mass of electrons($=9.1\times10^{-31}$ kg).

In this example the angle frequency of the $\omega$ of the microwave was established at 2.45 GHz, and by said formula (1), magnetic flux density B to fulfill the ECR condition was established at $8.75\times10^{-2}$ T.

In order to form a thin film by using said apparatus, firstly, by operating the exhaust system, the pressure in the main body 3 was reduced to less than $1\times10^{-6}$ Torr. After that, while TiCl$_4$ is supplied at a flow rate of 5~15 SCCM into the reaction chamber 2 through the first guide pipe 13, Ar at a flow rate of 43 SCCM, N$_2$ at a flow rate of 15 SCCM, and H$_2$ at a flow rate of 50 SCCM, were supplied into the plasma generation chamber 1 through the second guide pipe 15. Thereafter that, the pressure in the main body 3 was established in the prescribed pressure, such as $2\times10^{-3}$ Torr.

Moreover, turning on electricity in the radio frequency generation source 7 and applying voltage to the microwave inlet window 6, made a sputtering effect by RF, by which a thin film of TiN was prevented from depositing on the microwave inlet window 6.

On the other hand, introducing a microwave of 800 W from the microwave oscillator through the wave guide 5 into the plasma generation chamber 1, while connecting the exciting coil 4 with the direct current source, resulted in the formation of a magnetic field in the plasma generation chamber 1. Then, by making high energy electrons collide with material gas, which was activated to be ionized, resulted in generating a plasma.

Next, the plasma was passed through the second opening 12, introduced into the reaction chamber 2 with acceleration by the divergent magnetic field in the direction of an arrow A in FIG. 1, and formed a thin film of TiN on the surface of the sample 9 having a hole with aspect ratio of 0.2~1.0 and having been placed on the sample stage 8.

Figure 3A:
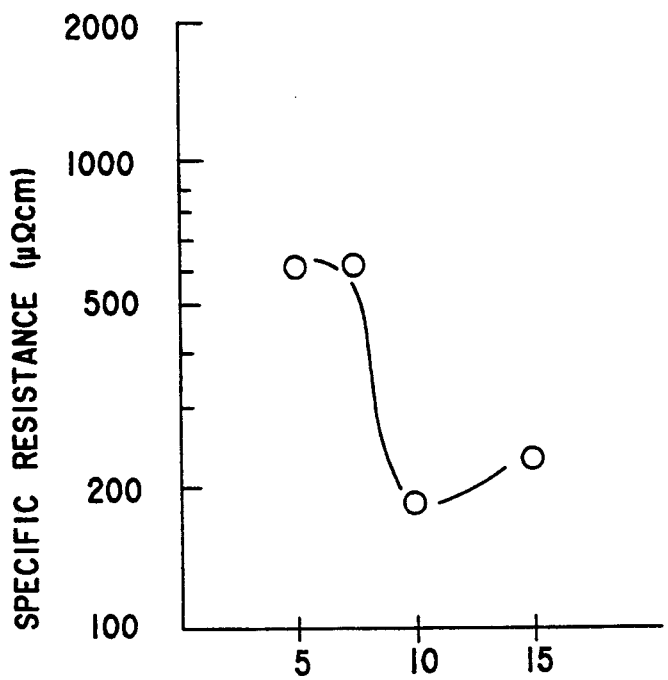
FIG. 3(a) is a graph indicating the relationship between flow rate of TiCl$_4$ gas and film resistivity and FIG. 3(b) is a graph indicating the relationship between flow rate of TiCl$_4$ gas and deposition rate.
Figure 3B:
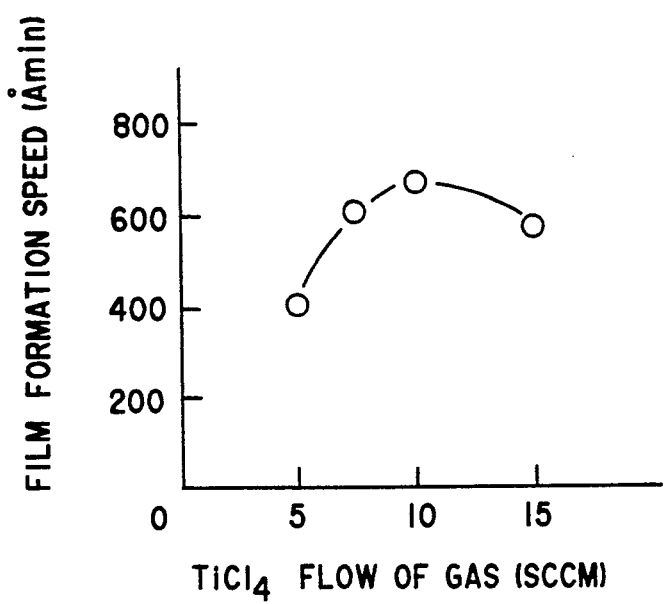

The relationship between flow rate of TiCl$_4$ gas and film forming speed, and the relationship between flow rate of TiCl$_4$ gas and film resistivity obtained in this example are shown in FIG. 3. As is obvious from FIG. 3, at gas flow rate of 10 SCCM, a film forming speed of 700 Å/min and film resistivity of 180$\mu$ $\Omega$ cm were obtained.

Example 2

Figure 2:
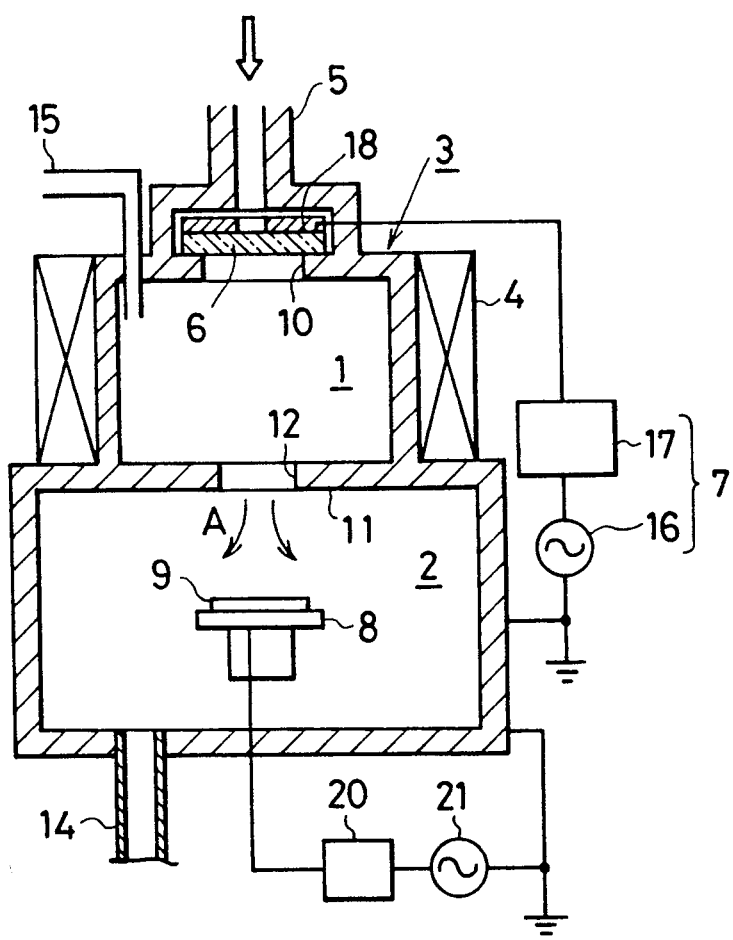
FIG. 2 is diagrammatic sectional view showing another example of a thin film formation device.

FIG. 2 is a diagrammatic sectional view showing another plasma CVD apparatus used for the method of forming a thin film according to the present invention.

Since the only structural difference of this plasma apparatus from the plasma apparatus in the example 1 is that it has no first guide pipe 13 connected at the side wall of the reaction chamber 2, the other structure being the same as the plasma apparatus in the example 1, a detailed explanation is omitted.

In order to form a thin film by using said plasma apparatus, first Ar, $H_2$ and $N_2$ gas and a metallic compound gas, $TiCl_4$ gas are introduced in the second guide pipe 15 connected with the plasma generation chamber 1.

The plasma gas formed by the action of the electric field generated by the microwave introduced through the wave guide 5 into the plasma generation chamber 1 and the magnetic field generated by the exciting coil 4, is introduced into the reaction chamber 2 by the divergent magnetic field generated by the exciting coil 4. The plasma gas is provided on the surface of the sample 9, on which a TiN film is thereby formed.

In this example, the flow rate of Ar gas was 43 SCCM, that of the $N_2$ gas was 15 SCCM, that of the $H_2$ gas was 50 SCCM, and that of the $TiCl_4$ gas was 10 SCCM. The temperature of the sample 9 was 600° C.

Also in this example, almost the same film forming speed and were obtained as that in the case of $TiCl_4$ gas flow rate of 10 SCCM shown in FIG. 3.

Figure 4:
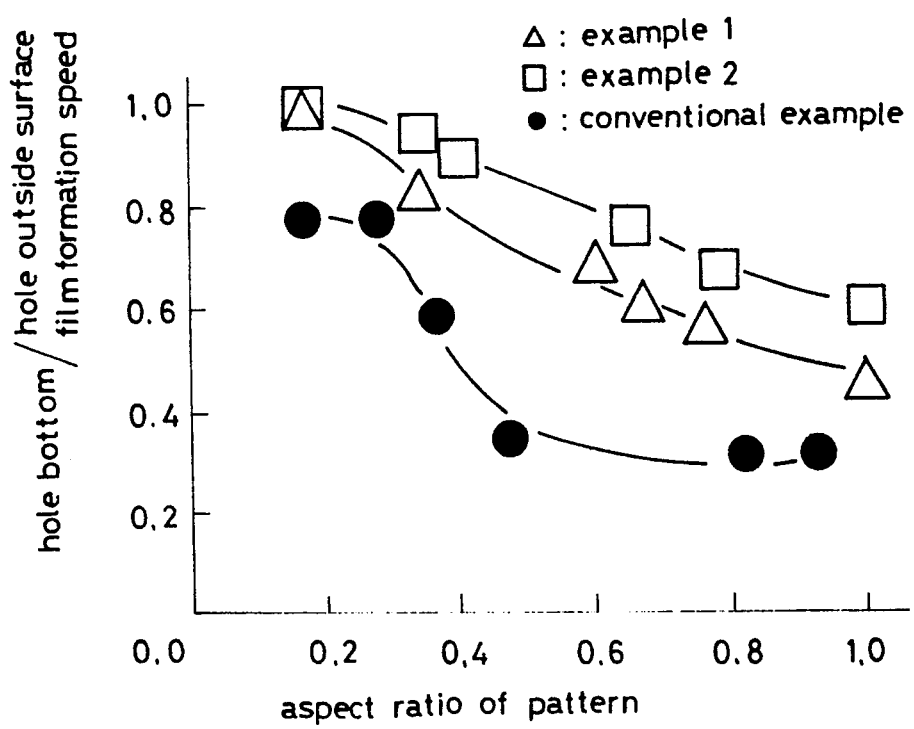
FIG. 4 is a graph indicating the relationship between the aspect ratio of a contact hole and hole bottom/hole outside surface deposition rate.

In FIG. 4, contrasted are the examples 1 and 2 and the result of the experiment disclosed in Japanese Patent Laid-Open Publication No. 3072/90 as prior art, the relationship between aspect ratio and hole bottom/hole outside surface film forming speed being shown. It is obvious from FIG. 4 that at a high aspect ratio, the hole bottom/hole outside surface film forming speed is excellent.

Example 3

Next, an insulating film of $SiO_2$ was formed on a P-type Si substrate, wherein a contact hole was formed, and by using the apparatus shown in FIG. 1 with the substrate as a sample, a thin film of TiN was formed on the inside surface of the contact hole.

Figure 5:
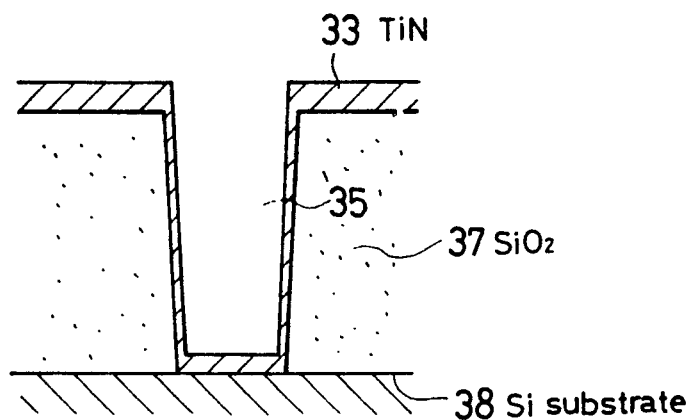
FIG. 5 is a sectional view showing a TiN film formed on the inside surface of the contact hole under the conditions of TiCl$_4$ flow of 10 SCCM and gas pressure of 1.3 mTorr.

First, by operating the exhaust system, the pressure in the main body 3 was reduced to $1 \times 10^{-6}$ Torr. Thereafter that, the $TiCl_4$ gas flow rate of 10 SCCM was supplied through the first guide pipe 13 into the reaction chamber 2, Ar at 43 SCCM, $H_2$ at 50 SCCM, and $N_2$ at 15 SCCM were supplied through the second guide pipe 15 into the plasma generation chamber 1. Under these conditions with changing gas pressure in the apparatus, the TiN film formation, especially the deposition of TiN film on the inside surface of the contact hole, was investigated. As a result, at less than 2.0 mTorr, the deposition was satisfactory, but at gas pressure of more than that, the deposition was unsatisfactory. A diagram based on a photomicrograph of a SEM scanning electron microscope, wherein a TiN film actually deposited on the inside surface of the contact hole of aspect ratio 2 is shown in FIG. 5. The deposition conditions were a gas pressure of 1.3 mTorr, microwave power of 2.8 kw, substrate temperature of 550° C., $TiCl_4$ at 10 SCCM, $H_2$ at 50 SCCM, $N_2$ at 15 SCCM, and Ar at 43 SCCM.

It is evident from FIG. 5 that a TiN film 33 was deposited on the side wall and bottom of the contact hole 35. The film thickness on the bottom was about 500~600 Å, and that on the side wall was 200~300 Å, while that on the insulating film was 1000 Å. In other words, the thickness of the film formed on the bottom of the contact hole 35 could be over 50% of that on the substrate surface.

Figure 6:
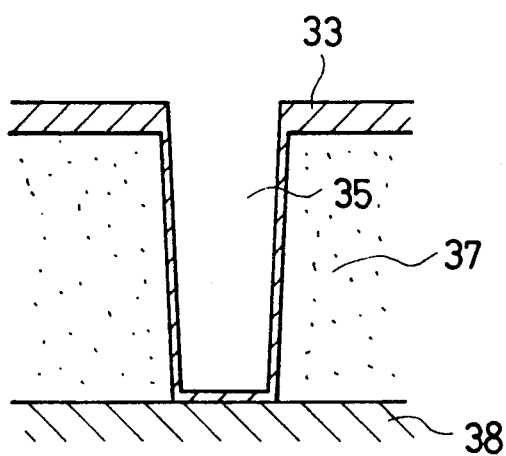
FIG. 6 is a sectional view showing a TiN film formed on the inside surface of the contact hole under the conditions of TiCl$_4$ flow of 10 SCCM and gas pressure of 3 mTorr.
Figure 7:
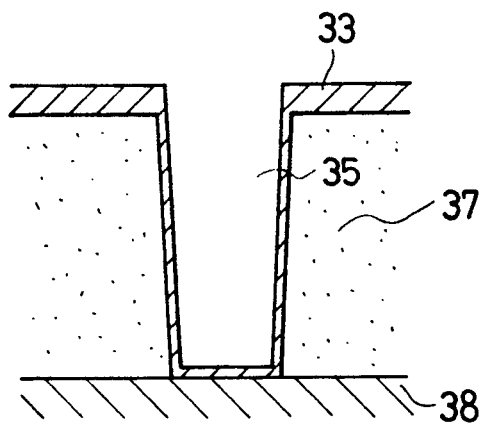
FIG. 7 is a sectional view showing a TiN film formed on the inside surface of the contact hole under the conditions of TiCl$_4$ flow of 10 SCCM and gas pressure of 5 mTorr.

As comparative examples, diagrams based on a photomicrograph by SEM, with a pressure in the main body 3 of 3 mTorr and 5 mTorr, the other deposition conditions being the same, are shown in FIGS. 6 and 7. Under these conditions, sufficient deposition was not obtained.

Example 4

Figure 8:
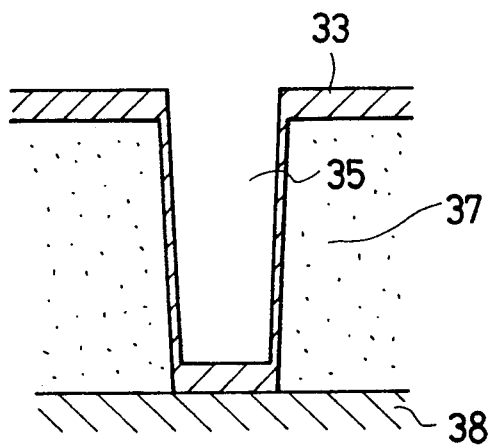
FIG. 8 is a sectional view showing a TiN film formed on the inside surface of the contact hole under the conditions of TiCl$_4$ flow of 5 SCCM and gas pressure of 0.7 mTorr.

The diagram based on a photomicrograph by SEM of FIG. 8 shows film formation under such conditions as pressure of 0.7 mTorr, $TiCl_4$ at 5 SCCM, Ar and $H_2$ at 50 SCCM, $N_2$ at 15 SCCM, microwave power at 2.8 kw, and substrate temperature of 550° C. It is obvious from this diagram that the thickness of the film formed on the bottom of the contact hole 35 was 70% of that on the substrate surface, a very excellent percentage.

As obvious from FIGS. 3 and 4, it is desirable that pressure in the main body 3 be set up at 2.0 mTorr, preferably less than 1.3 mTorr.

The plasma CVD method according to the present invention comprises activating gas by turning the gas into a plasma, introducing the activated gas along divergent magnetic flux line onto the sample, and forming a TiN film thereon. Accordingly, the activated gas molecules have orientation induced by the divergent magnetic field, and are irradiated on the sample almost vertically. As a result, the TiN film on the surface of the insulation around the contact hole and on the bottom of the hole becomes thick, while the TiN film on the side wall of the contact hole becomes thin. Since the TiN film is thick on the bottom of the contact hole, the film has good barrier characteristics. Since the TiN film is thin on the side wall of the contact hole, the diameter of the contact hole does not get so small, resulting in a less high aspect ratio after the TiN film formation. As a result, in the next step where electrode materials Al and W(tungsten) are filled in, the probability of forming voids decreases which results in that highly reliable interconnection is possible.

In FIG. 9(a), the TiN film 33 deposition around the contact hole 35 by the plasma CVD method according to the present invention is shown, and later, the state after filling in with W(tungsten) is shown in FIG. 9(b). In addition, in Table 1, data as to the film thickness formed by each film formation is shown.

TABLE 1

|  | Reactive Sputtering method | LPCVD method | ECR plasma CVD method | | |
| --- | --- | --- | --- | --- | --- |
|  |  |  | 5 m Torr | 1.3 m Torr | 0.7 m Torr |
| film thickness on Si substrate | 1000Å | 1000Å | 1000Å | 1000Å | 1000Å |
| film thickness on the side wall of the contact hole | 200Å | 1000Å | 100Å | 250Å | 250Å |
| film thickness on the bottom of the | 35Å | 1000Å | 300Å | 500Å | 700Å |

TABLE 1-continued

| | Reactive Sputtering method | LPCVD method | ECR plasma CVD method | | |
|---|---|---|---|---|---|
| | | | 5 m Torr | 1.3 m Torr | 0.7 m Torr |
| contact hole barrier characteristic | x | ○ | Δ | ○ | ○ |
| void occurrence when tungsten filled in<br>○ no voids occur<br>x voids occur | x<br>Because of much overhang on the upper corners, little tungsten can enter the hole | x<br>As the actual aspect ratio is 3/1, it is difficult for tungsten to be filled in the hole. | ○<br>The reason why the barrier characteristics gets a little worse seems to be that the film thickness on bottom became thin 300Å | ○ | ○ |

As described above, by the ECR plasma CVD method, the film formed on the bottom is thick, and in addition, in the next step of filling in with tungsten, no voids occurs.

Example 5

Figure 10:
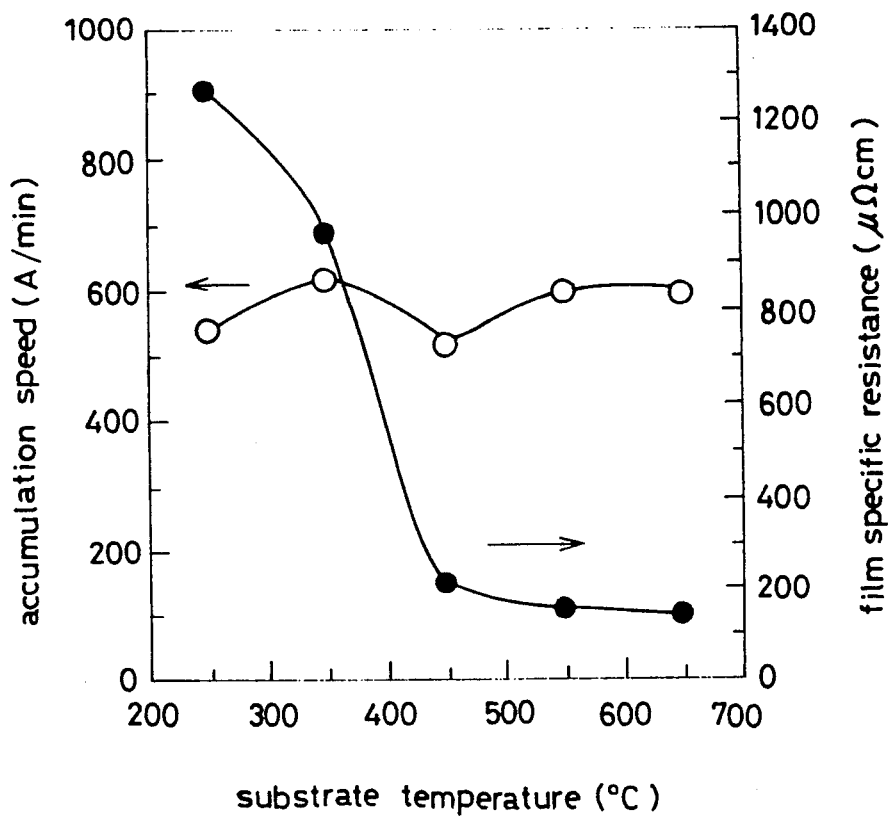
FIG. 10 is a graph indicating the relationship between the film resistivity of a TiN film formed by using a plasma CVD device and the substrate temperature, and the relationship between the deposition rate of a TiN film and the substrate temperature.

A curve written with (●) in FIG. 10 indicates the relationship between the film resistivity of the thin film formed at a microwave power of 1 kw, a gas pressure of 1.3 mTorr in the above-mentioned CVD apparatus, and (b) the temperature of the substrate. When the substrate temperature is more than 450° C., the film resistivity of a formed TiN film in comparison with 523μ Ω cm, the value obtained by the LPCVD method described in a prior art, became less than 200μ Ω cm, very small value, which is very excellent value in view of the function of electrically connecting the diffusion layer part and the electrode part of metal interconnection in the semiconductor device. To the contrary, when the substrate temperature is less than 450° C., the film resistivity value of the formed TiN film abruptly increases, thereby resulting in making the TiN film unsuitable for use.

In addition, the curve written with ○ in the FIG. 10 indicates the relationship between the forming speed of a TiN film and the substrate temperature under the conditions of a microwave power of 1 kw and a gas pressure of 1.3 mTorr. The curve indicates that there is no special correlation between both of them. Consequently, it is advantages to keep the temperature of the substrate at more than 450° C., preferably 550° C.

Example 6

Figure 11:
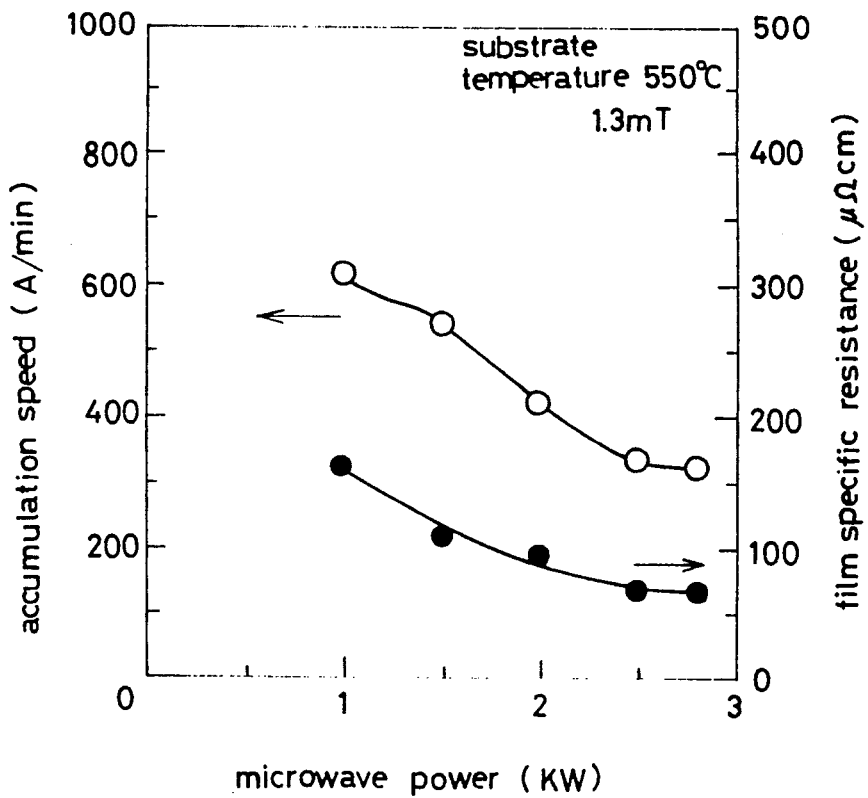
FIG. 11 is a graph indicating the relationship between the film resistivity of a TiN film formed using a plasma CVD device and microwave power, and the relationship between the deposition rate of a TiN film and microwave power.
Figure 12:
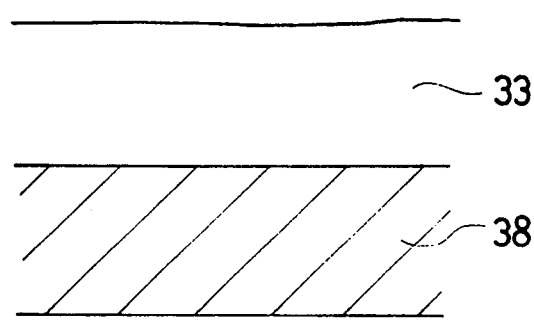
FIG. 12 is a sectional view showing the growth of a TiN film deposition on a Si substrate with a flow of TiCl$_4$ at 10 SCCM.

FIG. 11 indicates the relationship between microwave power and film forming speed (○) and that between microwave power and film resistivity (●). It was confirmed from FIG. 11 that a specific resistance of less than 200μ Ω cm was obtained at the microwave power of more than 1 kw, and a resistance less than 100μ Ω cm was obtained at more than 2 kw.

These results indicate that, compared with a film resistivity of 525μ Ω cm obtained by the LPCVD method of a prior art wherein only thermal reaction is used, the method according to the present invention, where both thermal reaction energy and plasma energy are used, is improved over the prior LPCVD method and that it is possible to achieve a practical use level.

EXAMPLE 7

The diagrams based on a photomicrograph by SEM of a TiN film deposited on a contact hole are shown in FIGS. 12~15.

The deposition conditions are microwave power of 1 kw and the same as the deposition conditions shown in FIG. 5, except the flow rate of TiCl4 gas was varied. It was comfirmed from FIG. 12 that the deposited TiN film does not have a column structure but a homogenous fine structure. Accordingly, it was expected that it has a good barrier characteristic.

Figure 13:
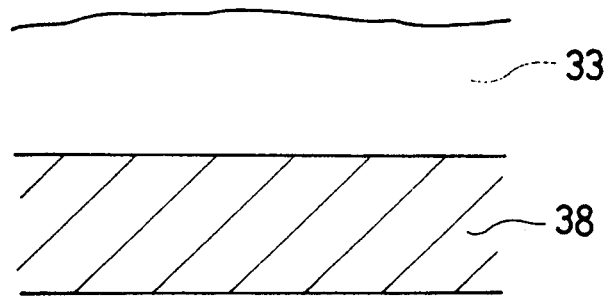
FIG. 13 is a sectional view showing the growth of a TiN film deposition on a Si substrate with a flow of TiCl$_4$ at 5 SCCM.
Figure 14:
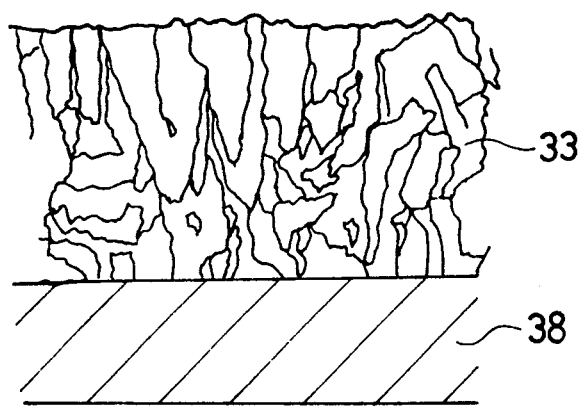
FIG. 14 is a sectional view showing the growth of a TiN film deposition on a Si substrate with a flow of TiCl$_4$ at 15 SCCM.
Figure 15:
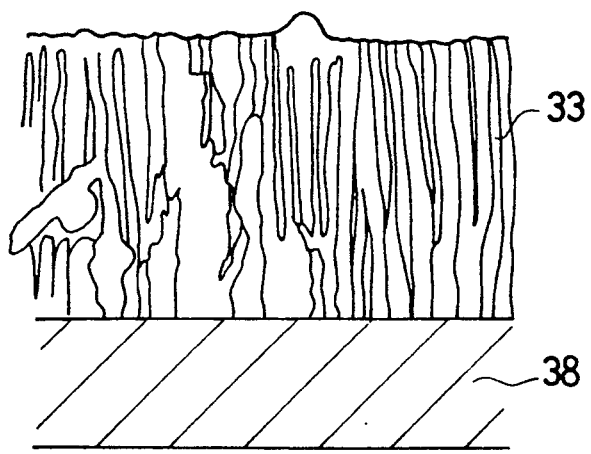
FIG. 15 is a sectional view showing the growth of a TiN film deposition on a Si substrate with a flow of TiCl$_4$ at 20 SCCM.

Flow rates of TiCl4 at 5 SCCM, TiCl4 at 15 SCCM, and TiCl4 at 20 SCCM are shown in FIGS. 13, 14 and 15 respectively, and illustrate the change of the structure of the TiN film was caused by changing the flow of TiCl4. In FIGS. 14 and 15, the TiN film has a column structure, while the TiN film in FIG. 13 has homogenous fine structure as well as that the film in FIG. 12.

In the case of a constant microwave power, as mentioned above, with increasing flow rate of TiCl4 gas, the structure of the TiN film tends to be columnar, while in the case of increasing microwave power, even with a large flow rate of TiCl4 gas, the structure of the TiN film can be homogenous and fine.

Next, the result of investigation of the relationship between microwave power, flow rate of TiCl4 gas and structure of a TiN film.

TABLE 2

| | | flow rate of TiCl4 (SCCM) | | | |
|---|---|---|---|---|---|
| | | 5 | 10 | 15 | 20 |
| microwave power (kw) | 1 | ○ | ○ | x | x |
| | 1.5 | ○ | ○ | Δ | x |
| | 2.0 | ○ | ○ | ○ | x |
| | 2.5 | ○ | ○ | ○ | Δ |
| | 2.8 | ○ | ○ | ○ | ○ |

○: no cylindrical construction/barrier characteristic good
Δ: some cylindrical construction occurs/barrier characteristic unstable
x: cylindrical construction occurs/barrier characteristic bad It was regarded from this result that even if the flow rate of TiCl4 gas was increased, correspondingly increasing the microwave power can prevent occurence of the column structure.

Example 8

Figure 16:
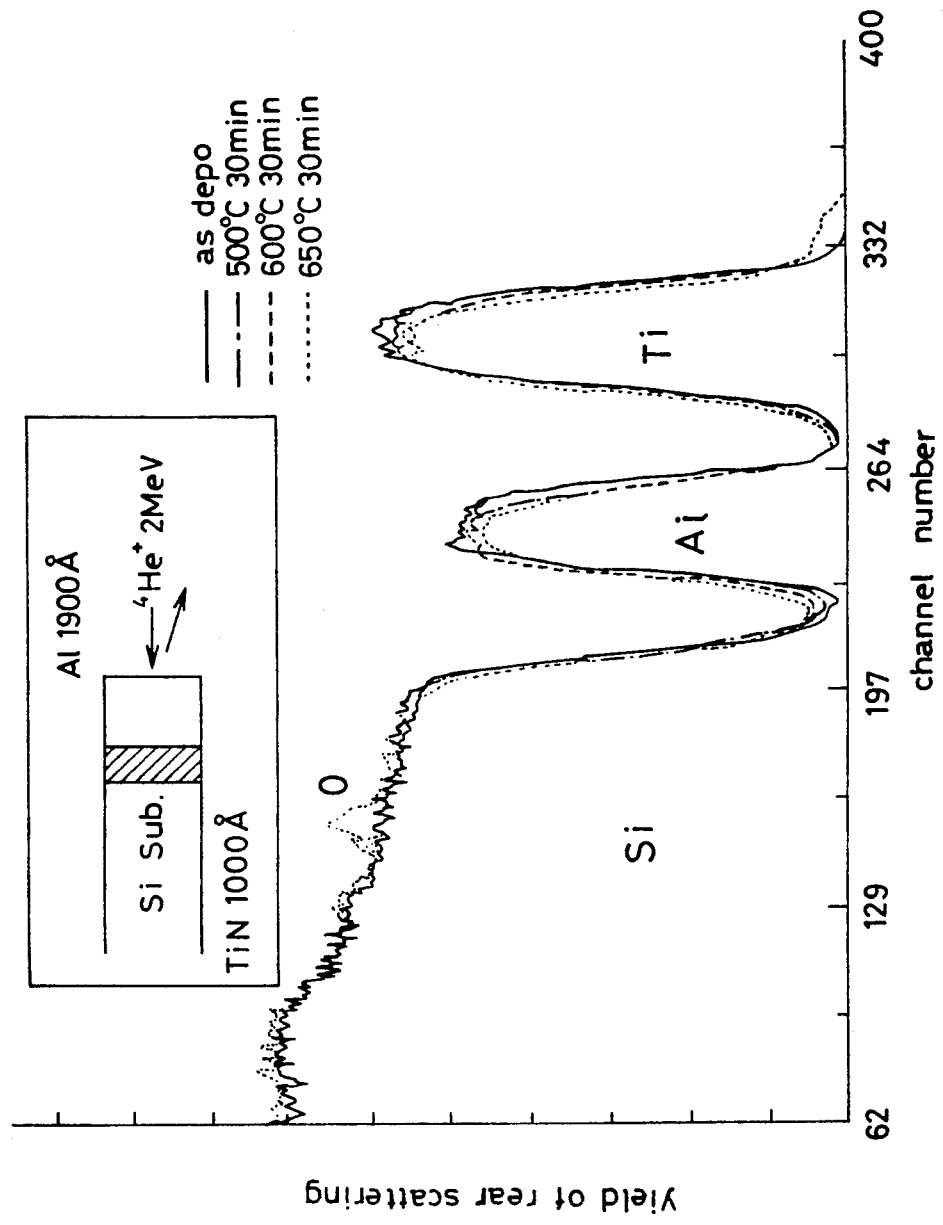
FIG. 16 is a diagram showing the result of a RBS analysis of the sample which is produced by forming a TiN film on a Si substrate and evaporating Al thereon.

The result of the experiment show the barrier characteristic is excellent, as is shown in FIG. 16, wherein the curves of Al and Ti do not expand horizontally.

FIG. 16 is a graph indicating the analysis result of the four samples as follows by RBS (Rutherford Backscattering Spectroscopy).

TiN film of 1000 Å is formed on a Si substrate, with Al deposited thereon. Sample (1) is unheated, sample (2) is heated at 500° C. for 30 minutes, sample (3) is heated at 600° C. for 30 minutes, and sample (4) is heated at 650° C. for 30 minutes. RBS comprises the steps of irradiating He atoms of a definite energy on the substrate, and, from the energy of the reflecting He, investigating the element distribution in the direction of the film thickness in the film. The energy loss of He which collided with every element is determined by element (atomic weight), that is, the lighter the element is, the lighter it goes. Accordingly, although the film construction is Al/TiN/Si, the peaks come in the order of Si, Ti, and Al. In addition, the width of each peak corresponds to the film thickness, so that a wide peak means diffusion (as Si is a substrate and wide, only the one side can be seen). It is obvious from FIG. 16 that the peaks have almost no change by heat treatment, and that even after the heat treatment at 650° C. for 30 minutes, it shows, high barrier characteristic (effect of preventing diffusion).

A diagram at the upper part in the frame indicates that in the film structure Al/TiN/Si, He was irradiated from the direction of Al, and the yield of He ions scattering backward was measured.

In the next step after forming a TiN film where the interconnction of a W alloy or an Al or Al alloy such as Al-Si-Cu is accomplished on the TiN film, when chlorine remains in the TiN film, the interconnection of Al and the like is heavily corroded by the chlorine. In some cases, an $AlCl_3$ insulating film is produced, resulting in the corrosion of the Al interconnection to the extent to which it can be observed with the naked eye. Therefore, it is an indispensable step to remove chlorine from a TiN film as much as possible.

Figure 17:
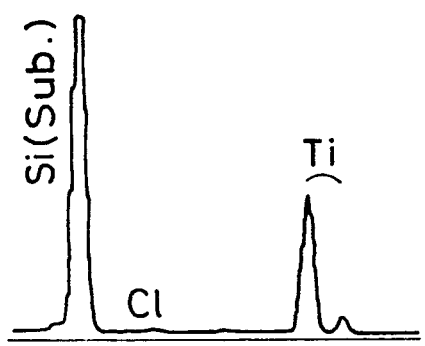
FIG. 17 is a diagram showing an EDX spectra of a TiN film formed on Si substrate with a microwave power of 1 kw.
Figure 18:
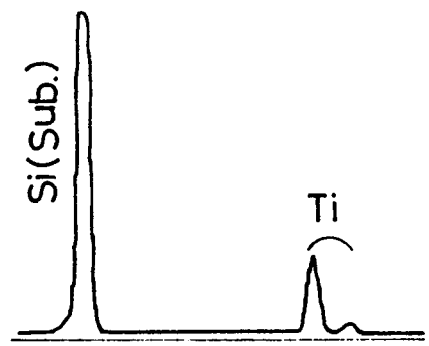
FIG. 18 is a diagram showing an EDX spectra of a TiN film formed Si substrate with a microwave power of 2.8 kw.

FIGS. 17 and 18 shows the EDX (Energy Dispersion-type X-ray analyzer) spectra of the TiN films formed at the microwave power of 1 kw and 2.8 kw, under the same deposition conditions as those in the examples according to the present invention. At the microwave power of 1 kw, a peak of chlorine Cl was noticed, while at 2.8 kw, no peak of chlorine Cl was noticed.

Thus, the contamination of chlorine Cl can be checked by enhancing the microwave power. In addition, chlorine Cl can be reduced by a $H_2$ plasma treatment after the TiN film formation.

Figure 19:
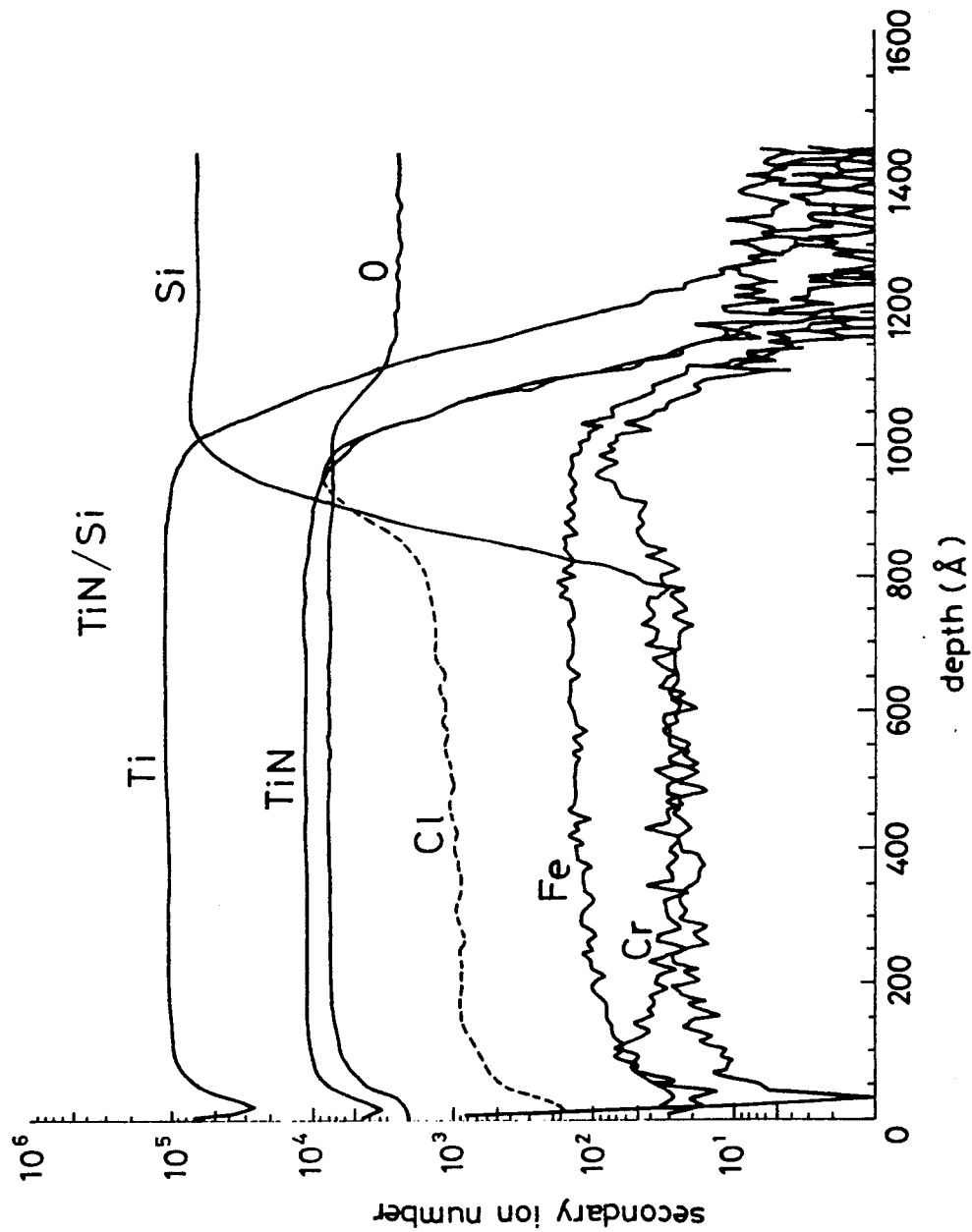
FIG. 19 is a diagram showing the result of a SIMS analysis of the surface of a Si substrate on which a TiN film is formed.

FIG. 19 indicates the analysis results by SIMS (Secondary Ion Mass Spectroscopy) from the surface of the sample given the $H_2$ plasma treatment after the TiN film formation in the direction of depth (vertically to TiN film toward the Si substrate).

The SIMS comprises the steps of digging the film in the direction of depth by irradiating oxygen ions and measuring the distribution of elements or molecules (e.g. TiN) existing in the direction of the depth. In other words, irradiating the high energy oxygen ions so that materials in the film are expelled, and analysis of the signal strength of the ions (the secondary ions) in the direction of depth.

In FIG. 19, the left side (on the vertical axis) is the surface side of a TiN film, and as going to the right, the depth dug down becomes greater. On the surface of the film, chlorine was reduced by the $H_2$ plasma treatment after the TiN film formation.

Thus, by the $H_2$ plasma treatment, the chlorine concentration on the surface of the TiN film can be reduced, thereby resulting in the prevention of corrosion of Al interconnection and the like by chlorine. The $H_2$ plasma treatment is by stopping the supply of Ti compound gas such as $TiCl_4$ and $N_2$ gas at the end of the treatment of the TiN film formation, and to supply Ar gas and $H_2$ gas in order to keep the state wherein a plasma is produced.

Figure 20:
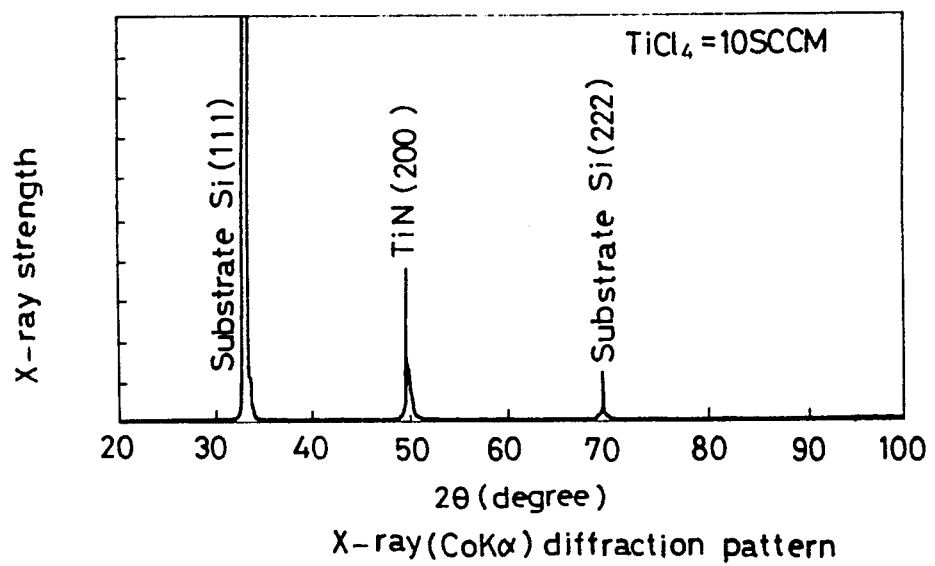
FIG. 20 is a X-ray diffraction pattern of a TiN film.
Figure 21:
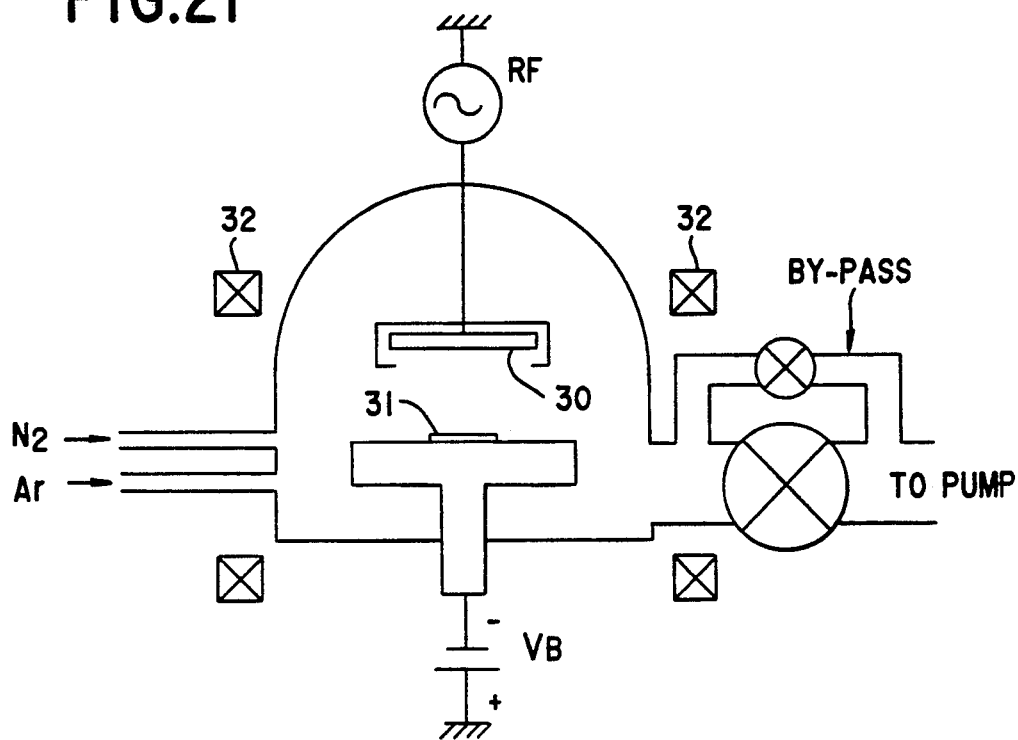
FIG. 21 is a diagrammatic sectional view of a Reactive Sputtering apparatus.
Figure 22A:
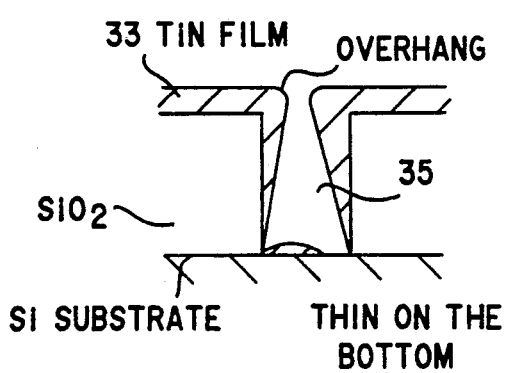
FIG. 22 (a) is a sectional view showing a TiN film formed on the contact hole by Reactive Sputtering method.
Figure 22B:
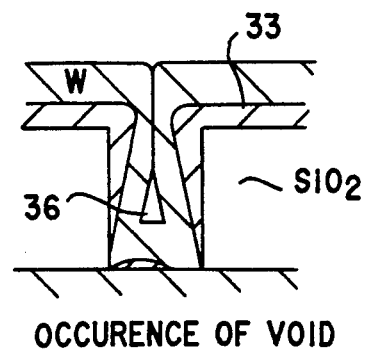
Figure 23:
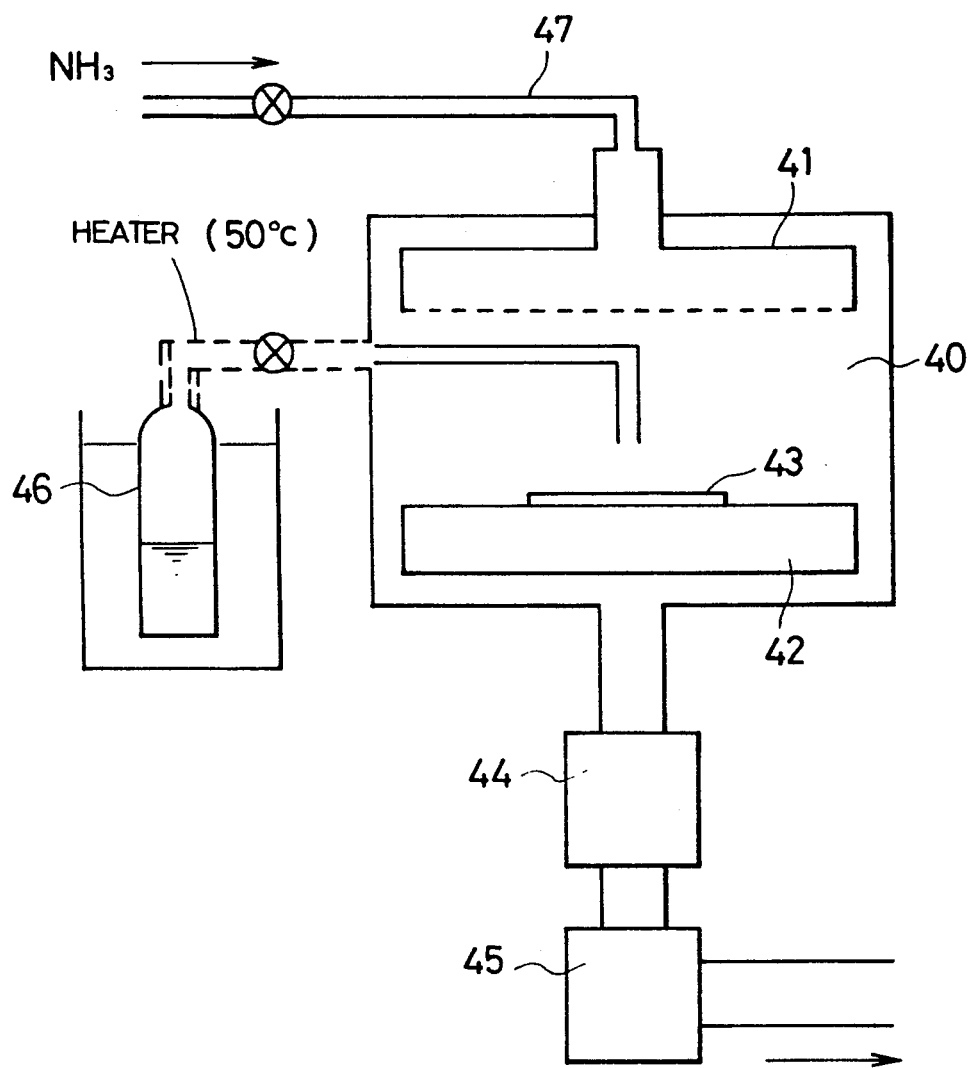
FIG. 23 is a diagrammatic sectional view showing the device used in the LPCVD method.

Next, a X-ray diffraction pattern of TiN film formed by the method according to the example is shown in FIG. 20. The pattern diagram indicates the crystals of TiN are oriented on the Si substrate (111) only in the direction (100). The deposition conditions were a microwave power of 1 kw, a substrate temperature of 550° C., flows of $N_2$ at 15 SCCM, $H_2$ at 50 SCCM, and Ar at 43 SCCM.

(100) oriented film has an excellent barrier characteristic, and it is speculated that the extremely strong (100) orientation of a TiN film formed by the method according to the example may be based on the directionality of the plasma.

As obvious from the above-mentioned explanations, with the method for forming a thin film according to the present invention, the method is capable of forming a metal nitride film having good step coverage, and is capable of forming a thin film which can sufficiently maintain a barrier characteristic on the contact hole, even if a LSI device gets more highly integrated and aspect ratio of the contact hole formed on a insulation layer becomes larger.

In addition, the film thickness of the thin film formed on the side wall of the contact hole can be made thinner than that on the bottom of the contact hole, and by keeping a barrier characteristic on the bottom of the contact hole, the aspect ratio of the contact hole after forming a thin film can be refrained from enhanced. Accordingly, in the following step of filling in with interconnection materials, no voids occur in the contact hole, resulting in preventing interconnection from broken and improving reliability of a LSI device.

Futhermore, it is possible to form a thin film at such a low temperature as no adverse influence is given in producing a LSI device, and in addition, with no particles such as yellow powder produced, to thereby produce even more reliable LSI devices.

What is claimed is:

1. A method for generating a thin film, comprising the steps of:
   introducing Ar, $H_2$ and $N_2$ gas into a plasma generation chamber, and introducing $TiCl_4$ gas into one of the plasma generation chamber or a reaction chamber;
   generating a plasma in the plasma generation chamber by action of an electric field generated by a microwave and a magnetic field generated by an exciting coil arranged around the plasma generation chamber; and
   introducing the generated plasma into a reaction chamber by the magnetic field so as to form a thin Ti nitride film on a sample placed on a sample stage in the reaction chamber;
   wherein said sample is a substrate of a semiconductor device having an insulating film and having a contact hole thereon, the pressure in the reaction chamber is less that 2.0 mTorr, and the temperature of said substrate forming the sample is more than 450° C.

2. A method according to claim 1, wherein, said pressure in the reaction chamber is less than 1.3 mTorr, and the Ti nitride film is formed on the contact hole.

3. A method according to claim 1 or 2, wherein the electric field is formed by applying RF to a microwave inlet window in the plasma generation chamber.

4. A method according to claim 1, wherein the thickness of the Ti nitride film formed on the bottom of the contact hole is thicker than the Ti nitride film on a side wall of the contact hole.

5. A method according to claim 2, wherein the thickness of the Ti nitride film formed on the bottom of the contact hole is thicker than the Ti nitride film on a side wall of the contact hole.

6. A method according to claim 1, wherein the thickness of the Ti nitride film formed on a side wall of the contact hole is 20–60% of the Ti nitride film on the bottom of the contact hole.

7. A method according to claim 2, wherein the thickness of the Ti nitride film formed on a side wall of the contact hole is 20–60% of the Ti nitride film on the bottom of the contact hole.

8. A method according to claim 1 or claim 2, wherein $H_2$ plasma treatment is carried out after forming the metal nitride film.

* * * * *